(12) United States Patent
Lim et al.

(10) Patent No.: US 7,678,625 B2
(45) Date of Patent: Mar. 16, 2010

(54) METHODS OF FABRICATING SEMICONDUCTOR DEVICES INCLUDING CHANNEL LAYERS HAVING IMPROVED DEFECT DENSITY AND SURFACE ROUGHNESS CHARACTERISTICS

(75) Inventors: Jong-Heun Lim, Seoul (KR); Chang-Ki Hong, Gyeonggi-do (KR); Bo-Un Yoon, Seoul (KR); Seong-Kyu Yun, Seoul (KR); Suk-Hun Choi, Gyeonggi-do (KR); Sang-Yeob Han, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 11/962,742

(22) Filed: Dec. 21, 2007

(65) Prior Publication Data

US 2008/0160726 A1    Jul. 3, 2008

(30) Foreign Application Priority Data

Dec. 27, 2006  (KR) .................. 10-2006-0134399

(51) Int. Cl.
*H01L 21/84* (2006.01)
(52) U.S. Cl. .................. 438/153; 257/E21.561; 438/151; 438/692
(58) Field of Classification Search ......... 438/151–166, 438/692; 257/E21.561
See application file for complete search history.

(56) References Cited

U.S. PATENT DOCUMENTS 6,162,368 A * 12/2000 Li et al. .................. 216/89

6,468,844 B1 * 10/2002 Yamazaki et al. ........... 438/156
6,919,238 B2 *  7/2005 Bohr .......................... 438/166
7,125,776 B2 * 10/2006 Achuthan et al. ........... 438/283

FOREIGN PATENT DOCUMENTS

| JP | 10-106951      | 4/1998 |
| KR | 1020030015618 A | 2/2003 |
| KR | 1020050086350 A | 8/2006 |

* cited by examiner

*Primary Examiner*—Richard A. Booth
(74) *Attorney, Agent, or Firm*—Myers Bigel Sibley & Sajovec, P.A.

(57) ABSTRACT

A method of fabricating a semiconductor device including a channel layer includes forming a single crystalline semiconductor layer on a semiconductor substrate. The single crystalline semiconductor layer includes a protrusion extending from a surface thereof. A first polishing process is performed on the single crystalline semiconductor layer to remove a portion of the protrusion such that the single crystalline semiconductor layer includes a remaining portion of the protrusion. A second polishing process different from the first polishing process is performed to remove the remaining portion of the protrusion and define a substantially planar single crystalline semiconductor layer having a substantially uniform thickness. A sacrificial layer may be formed on the single crystalline semiconductor layer and used as a polish stop for the first polishing process to define a sacrificial layer pattern, which may be removed prior to the second polishing process. Related methods of fabricating stacked semiconductor memory devices are also discussed.

19 Claims, 7 Drawing Sheets

METHODS OF FABRICATING SEMICONDUCTOR DEVICES INCLUDING CHANNEL LAYERS HAVING IMPROVED DEFECT DENSITY AND SURFACE ROUGHNESS CHARACTERISTICS

CROSS-REFERENCE TO RELATED APPLICATIONS

This application claims priority under 35 USC §119 to Korean Patent Application No. 10-2006-0134399, filed on Dec. 27, 2006 in the Korean Intellectual Property Office (KIPO), the disclosure of which is incorporated by reference herein in its entirety.

FIELD OF THE INVENTION

The present invention relates to semiconductor devices, and more particularly, to methods of forming channel layers in semiconductor devices.

BACKGROUND OF THE INVENTION

In semiconductor devices, sizes of patterns formed on a chip and/or distances between adjacent patterns may be decreased in order to realize higher degrees of integration. When the sizes of the patterns are decreased, the patterns may have an increased resistance. Thus, increasing the degree of integration by decreasing the sizes of the patterns may have its limits. Accordingly, instead of decreasing the sizes of the patterns, stacked semiconductor devices in which unit elements (such as metal-oxide-semiconductor (MOS) transistors) are stacked on a substrate in order to realize a higher degree of integration have been developed.

More particularly, a static random access memory (SRAM) device may have a relatively large cell size because the cell of the SRAM device includes six transistors. When the size of the cell is increased, the number of chips manufactured on a substrate may be decreased, so that the manufacturing cost of the SRAM device may be increased. Thus, transistors included in a cell may be vertically stacked so that the cell in the SRAM device may have a decreased size.

A single crystalline silicon layer serving as a channel may be formed on a single crystalline silicon substrate for forming a stacked memory device. The single crystalline silicon layer may include relatively few crystal defects in order for the single crystalline silicon layer to serve as a channel in a transistor. Additionally, the single crystalline silicon layer may have a relatively planar flat upper surface so that patterns on the single crystalline silicon layer may not be tilted.

A method of forming a single crystalline silicon layer is disclosed in U.S. Pat. No. 5,494,823 issued to Kobayashi. According to U.S. Pat. No. 5,494,823, an amorphous silicon layer is formed on a single crystalline silicon substrate, and the amorphous silicon layer is thermally treated at a temperature of about 600° C. to about 620° C. to be transformed into a single crystalline silicon layer. When the amorphous silicon layer is formed, nitrogen gas is used.

However, when the amorphous silicon layer is transformed into the single crystalline silicon layer by the thermal treatment, protrusions may be formed on an upper portion of the single crystalline silicon layer so that the single crystalline silicon layer may have relatively poor surface roughness characteristics. Thus, some recent research has been focused on developing methods of forming a single crystalline silicon layer having a substantially flat upper surface. For example, a method of forming a single crystalline silicon layer having a high degree of flatness by oxidizing a top surface of the single crystalline silicon layer to form an oxide layer and then removing the oxide layer is disclosed in Japanese Laid-Open Patent Publication No. 1998-106951. However, protrusions on an upper portion of a single crystalline silicon layer may not be sufficiently removed by the method disclosed in Japanese Laid-Open Patent Publication No. 1998-106951.

SUMMARY OF THE INVENTION

Some embodiments of the present invention provide methods of forming silicon channel layers having fewer crystal defects and improved roughness characteristics as compared to silicon channel layers formed by conventional methods. Some embodiments of the present invention also provide methods of manufacturing stacked semiconductor devices including such silicon channel layers.

According to some embodiments of the present invention, in a method of fabricating a semiconductor device including a channel layer, a single crystalline silicon layer is formed on a single crystalline silicon substrate. The single crystalline silicon layer includes a protrusion extending from a surface thereof. A sacrificial layer is formed on the single crystalline silicon layer. A portion of the sacrificial layer and a portion of the protrusion of the single crystalline silicon layer is removed in a first polishing process to define a sacrificial layer pattern and a remaining portion of the protrusion. The sacrificial layer pattern is removed. The surface of the second single crystalline silicon layer is planarized in a second polishing process to remove the remaining portion of the protrusion and define a substantially planar silicon channel layer.

In some embodiments, prior to forming the single crystalline silicon layer, an insulating interlayer having an opening extending therethrough may be formed on the single crystalline silicon substrate. The opening may expose a surface of the single crystalline silicon substrate. A single crystalline silicon pattern may be formed on the exposed surface of the single crystalline silicon substrate to fill the opening.

In other embodiments, the single crystalline silicon pattern may be formed by a selective epitaxial growth (SEG) process using the exposed surface of the single crystalline silicon substrate as a seed.

In some embodiments, forming the single crystalline silicon layer may include forming an amorphous silicon layer on the insulating interlayer and the single crystalline silicon pattern, and crystallizing the amorphous silicon layer to form the single crystalline silicon layer using the single crystalline silicon pattern as a seed.

In other embodiments, the amorphous silicon layer may be formed to a thickness of about 500 Å to about 5000 Å.

In some embodiments, the amorphous silicon layer may be crystallized by scanning a laser beam onto the amorphous silicon layer.

In other embodiments, the sacrificial layer may be formed to a thickness of about 10 Å to about 1000 Å.

In some embodiments, the sacrificial layer may be formed of silicon oxide and/or silicon nitride.

In other embodiments, the first polishing process may be performed using a slurry having a higher polishing rate with respect to the single crystalline silicon layer than the sacrificial layer.

In some embodiments, the first polishing process may be performed using a slurry including about 0.5% to about 20% by weight of a silica abrasive, about 0.001% to about 1.0% by weight of an amine compound, and/or about 0.001% to about 1.0% by weight of a surfactant and water. The slurry may have a pH from about 8 to about 12 when the sacrificial layer includes a silicon oxide.

In other embodiments, the first polishing process may be performed until the remaining portion of the protrusion of the single crystalline silicon layer is about 5% to about 50% of an initial height of the protrusion.

In some embodiments, the second polishing process may be performed until the silicon channel layer has a surface roughness RMS of about 0.5 Å to about 5 Å.

In other embodiments, the sacrificial layer pattern may be removed by a wet etching process.

According to other embodiments of the present invention, in a method of manufacturing a stacked memory device, an insulating interlayer having an opening extending therethrough is formed on a single crystalline silicon substrate. The opening exposes a surface of the single crystalline silicon substrate. A single crystalline silicon pattern is formed on the exposed surface of the single crystalline silicon substrate to fill the opening. A single crystalline silicon layer is formed on the insulating interlayer and the single crystalline silicon pattern. The single crystalline silicon layer includes a protrusion extending from a surface thereof. A sacrificial layer is formed on the single crystalline silicon layer. A portion of the sacrificial layer and a portion of the protrusion of single crystalline silicon layer are removed in a first polishing process to define a sacrificial layer pattern and a remaining portion of the protrusion. The sacrificial layer pattern is removed. The surface of the single crystalline silicon layer is planarized in a second polishing process to remove the remaining portion of the protrusion and define a substantially planar silicon channel layer. A transistor is formed on the silicon channel layer.

In some embodiments, a second transistor may be formed on the single crystalline silicon substrate prior to forming the insulating interlayer thereon.

In other embodiments, forming the first single crystalline silicon layer may include forming an amorphous silicon layer on the insulating interlayer and the single crystalline silicon pattern, and crystallizing the amorphous silicon layer to form the single crystalline silicon layer using the single crystalline silicon pattern as a seed.

In some embodiments, crystallizing the amorphous silicon layer may be performed by scanning a laser beam onto the amorphous silicon layer.

In other embodiments, the first polishing process may be performed using a slurry having a higher polishing rate with respect to the single crystalline silicon layer than the sacrificial layer.

In some embodiments, the first polishing process may be performed until the remaining portion of the protrusion of the single crystalline silicon layer is about 5% to about 50% of an initial height of the protrusion.

In other embodiments, the second polishing process may be performed until the silicon channel layer has a surface roughness RMS of about 0.5 Å to about 5 Å.

According to still other embodiments of the present invention, in a method of fabricating a semiconductor device, a single crystalline semiconductor layer is formed on a semiconductor substrate. The single crystalline semiconductor layer has a protrusion extending from a surface thereof. A first polishing process is performed on the single crystalline semiconductor layer to remove a portion of the protrusion such that the single crystalline semiconductor layer includes a remaining portion of the protrusion. A second polishing process that is different from the first polishing process is performed to remove the remaining portion of the protrusion and define a substantially planar single crystalline semiconductor layer having a substantially uniform thickness.

In some embodiments, a sacrificial layer may be formed on the single crystalline semiconductor layer, and the first polishing process may be performed using the sacrificial layer as a polish stop to remove a majority of the protrusion and define a sacrificial layer pattern on the surface of the single crystalline semiconductor layer adjacent the remaining portion of the protrusion. The sacrificial layer pattern may be removed prior to performing the second polishing process.

Thus, according to some embodiments of the present invention, a silicon channel layer having improved surface roughness characteristics and a substantially uniform thickness may be formed even though relatively little of a relatively thin single crystalline silicon layer may be removed in polishing processes for forming the silicon channel layer. Thus, a transistor formed on the silicon channel layer may have improved characteristics, and stacked memory devices including such a transistor may have improved performance. Therefore, according to some embodiments of the present invention, a fine pattern may be simply formed using a double mask pattern and defect generation in the fine pattern may be decreased so that some embodiments of the present invention may be employed in manufacturing semiconductor devices.

DETAILED DESCRIPTION OF EMBODIMENTS OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIGS. 1 to 7 are cross-sectional views illustrating methods of forming a silicon channel layer in accordance with some embodiments of the present invention.

Figure 1:
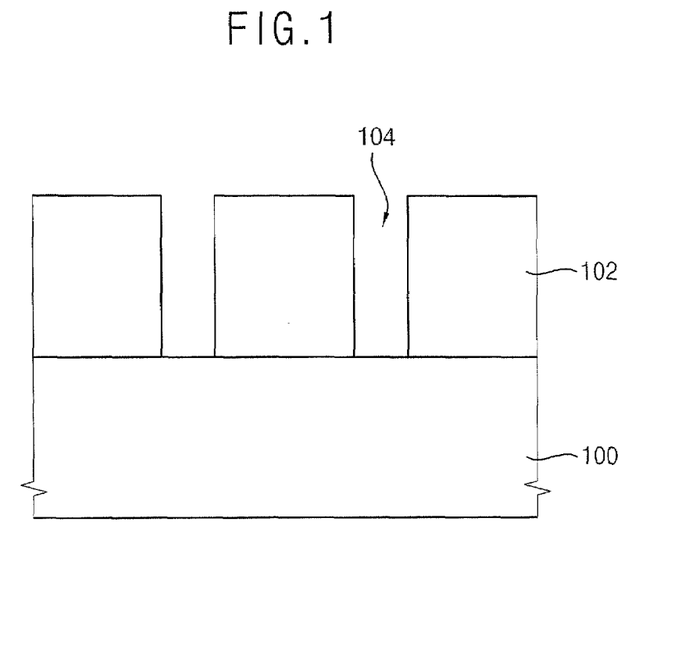
FIGS. 1 to 7 are cross-sectional views illustrating methods of forming a silicon channel layer in accordance with some embodiments of the present invention.

Referring to FIG. 1, an insulating interlayer 102 is formed on a substrate 100 including single crystalline silicon. The insulating interlayer 102 may be formed by a chemical vapor deposition (CVD) process using a silicon oxide. For example, the insulating interlayer 102 may be formed using a silicon oxide such as high plasma density chemical vapor deposition (HDP-CVD) oxide, borophosphosilicate glass (BPSG) oxide, undoped silicate glass (USG) oxide, spin-on glass (SOG) oxide, phosphosilicate glass (PSG) oxide, etc. These may be used alone or in combination.

The insulating interlayer 102 is partially removed by an etching process to form an opening 104 exposing an upper portion of the substrate 100. When the opening 104 is formed, a natural oxide layer may be formed on the exposed portion of the substrate 100. A wet treatment process using hydrogen fluoride (HF) solution may be performed to remove the natural oxide layer on the substrate 100.

Figure 2:
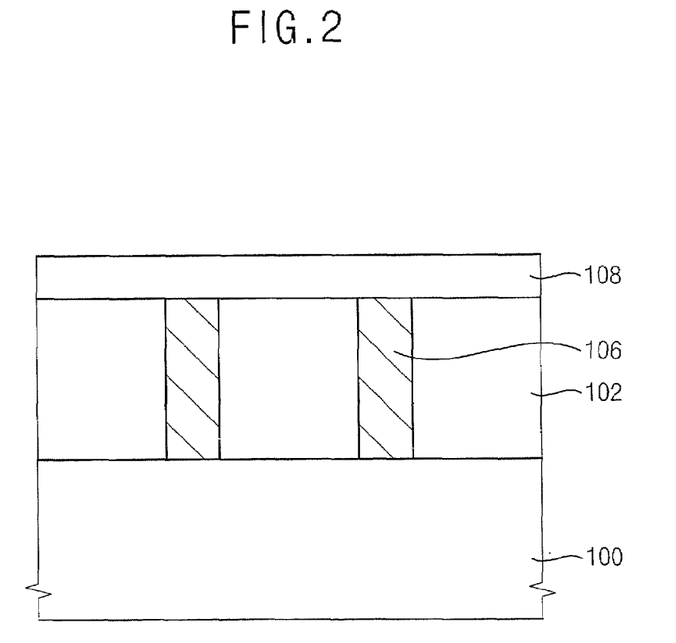

Referring to FIG. 2, a selective epitaxial growth (SEG) process using the exposed upper portion of the substrate 100 as a seed in which single crystalline silicon is grown is performed, thereby forming an epitaxial layer pattern 106 filling the opening 104.

When the SEG process is performed at a temperature below about 750° C., the epitaxial layer pattern 106 may not be easily grown. When the SEG process is performed at a temperature above about 1,250° C., controlling growth of the epitaxial layer pattern 106 may not be easily performed. Thus, the SEG process may be performed at a temperature of about 750° C. to about 1,250° C. For example, in some embodiments, the SEG process may be performed at a temperature of about 800° C. to about 900° C.

A reaction gas for forming the epitaxial layer pattern 106 may include a silicon source gas. Examples of the silicon source gas may include tetrachlorosilane ($SiCl_4$) gas, silane ($SiH_4$) gas, dichlorosilane ($SiH_2Cl_2$) gas, trichlorosilane ($SiHCl_3$) gas, etc. These may be used alone or in combination.

An amorphous silicon layer 108 is formed on the insulating interlayer 102 and the epitaxial layer pattern 106. The amorphous silicon layer 108 may be formed by a CVD process. When the amorphous silicon layer 108 is formed to have a thickness below about 500 Å, a silicon channel layer 116 (see FIG. 7) successively formed from the amorphous silicon layer 108 may not have a sufficient thickness to be reliably used as a channel layer. Additionally, when the amorphous silicon layer 108 is formed to have a thickness above about 5,000 Å, the silicon channel layer 116 may have a greater defect density. Thus, the amorphous silicon layer 108 may be formed to have a thickness of about 500 Å to about 5,000 Å. However, in some embodiments, the amorphous silicon layer 108 may have a thickness that is not included in the above thickness range based on a desired thickness of the silicon channel layer 116.

Figure 3:
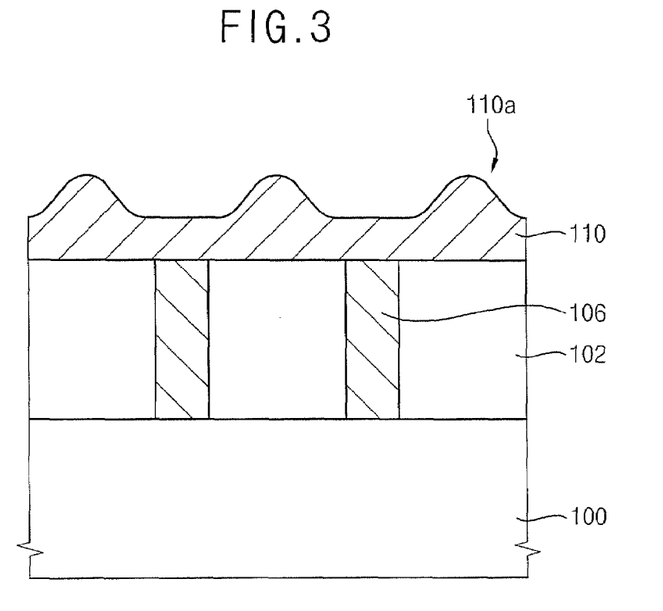

Referring to FIG. 3, the amorphous silicon layer 108 is phase-transformed into a single crystalline silicon layer, so that a first single crystalline silicon layer 110 may be formed. In an example embodiment of the present invention, a laser beam is irradiated on the amorphous silicon layer 108, so that the amorphous silicon layer 108 may be transformed into the first single crystalline silicon layer 110.

More particularly, the laser beam is irradiated on the amorphous silicon layer 108 so that the amorphous silicon layer 108 may be substantially melted. Thus, the solid-phase amorphous silicon layer 108 may be changed into a liquid-phase amorphous silicon layer (not shown). The epitaxial layer pattern 106 having single crystalline silicon serves as a seed for the liquid-phase amorphous silicon layer, so that the liquid-phase amorphous silicon layer may be transformed into a single crystalline silicon layer, that is, the first single crystalline silicon layer 110. Even though the solid-phase amorphous silicon layer 108 has been transformed into the liquid-phase amorphous silicon layer, the liquid-phase amorphous silicon layer does not flow down because a phase-change and a crystal structure change of the amorphous silicon layer 108 may require only several nano-seconds.

The laser beam may be irradiated to heat the solid-phase amorphous silicon layer 108, to a temperature at which the solid-phase amorphous silicon layer 108 may be transformed into the liquid-phase amorphous silicon layer. For example, the laser beam may be irradiated on the solid-phase amorphous silicon layer 108 to a melting point of amorphous silicon, that is, about 1,410° C.

In an example embodiment of the present invention, an excimer laser beam may be irradiated on the amorphous silicon layer 108. A laser beam may be irradiated on the amorphous silicon layer 108 by a scanning process because the laser beam may be irradiated for a relatively short time in the scanning process.

The single crystalline silicon substrate 100 may also be heated when the laser beam is irradiated on the amorphous silicon layer 108. Heating the single crystalline silicon substrate 100 may reduce a temperature gradient of a portion of the amorphous silicon layer 108 where a phase-change is generated in the laser beam irradiation process. For example, the single crystalline silicon substrate 100 may be heated to a temperature of about 400° C. in the laser beam irradiation process.

As described above, the amorphous silicon layer 108 is transformed into the first single crystalline silicon layer 110 on the insulating interlayer 102 and the epitaxial layer pattern 106 by irradiating a laser beam onto the amorphous silicon layer 108 to change the crystal structure thereof.

The first single crystalline silicon layer 110 formed by the phase-change includes a plurality of protrusions 110a protruding from a top surface of the first single crystalline silicon layer 110. More particularly, portions of the amorphous silicon layer 108 adjacent to the epitaxial layer pattern 106 having a single crystalline structure and serving as a seed are first crystallized, and thus portions of the amorphous silicon layer 108, between the epitaxial layer pattern 106 may have the protrusions 110a because many crystallized grains may be piled up therein.

Unit elements may not be directly formed on the first single crystalline silicon layer 110 because the single crystalline silicon layer 110 has the protrusions 110a. Thus, planarization of the top surface of the single crystalline silicon layer 110 may be required.

Figure 4:
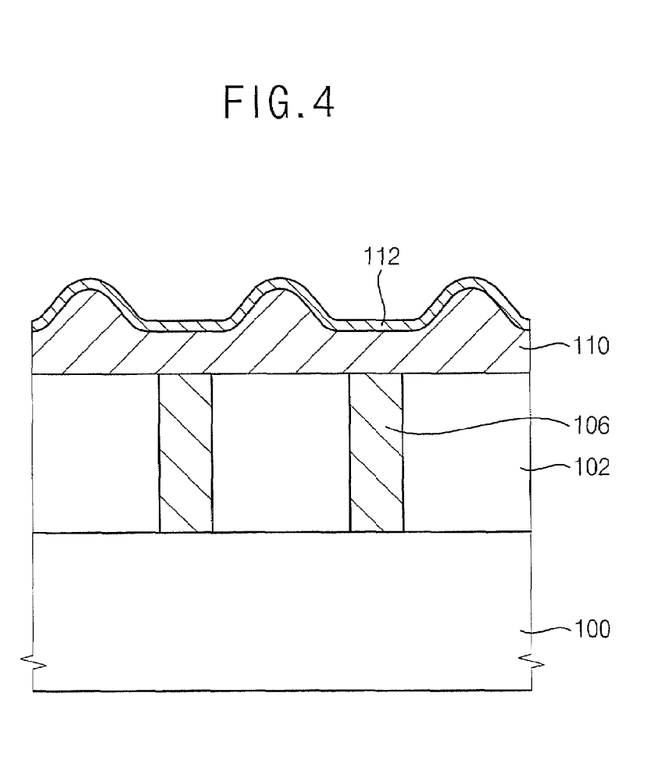

Referring to FIG. 4, a sacrificial layer 112 is formed on the single crystalline silicon layer 110. The sacrificial layer 112 may serve as a polish stop layer in a subsequent polishing process. The sacrificial layer 112 is conformally formed on top surfaces of the single crystalline silicon layer 110. That is, the sacrificial layer 112 is formed on the single crystalline silicon layer 110 to have a substantially uniform thickness and does not substantially fill up a space between the protrusions 110a.

When the sacrificial layer 112 has a thickness below about 10 Å, the sacrificial layer 112 may not serve as a polish stop layer. When the sacrificial layer 112 has a thickness above about 1,000 Å, the protrusions 110a of the first single crystalline silicon layer 110 may be polished too slowly. Thus, the sacrificial layer 112 may be formed to a thickness of about 10 Å to about 1,000 Å.

The sacrificial layer 112 may be formed using a material having a polishing selectivity with respect to single crystalline silicon. In an example embodiment of the present invention, the sacrificial layer 112 may be formed using a material that is polished more slowly than single crystalline silicon. For example, the sacrificial layer 112 may be formed by a deposition process using silicon oxide or silicon nitride.

Figure 5:
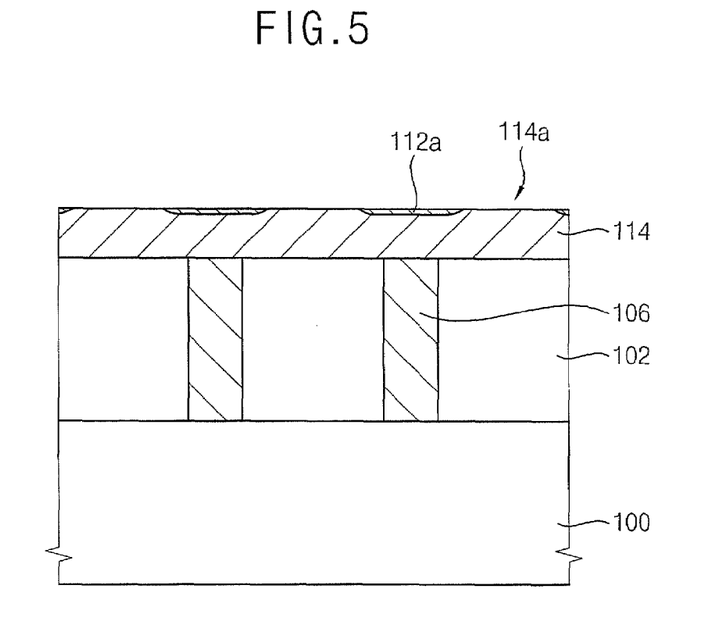

Referring to FIG. 5, portions of the protrusions 110a and portions of the sacrificial layer 112 on the protrusions 110a are removed by a first polishing process, so that a second single crystalline silicon layer 114 including remaining portions of the protrusions 110a and a remaining sacrificial layer pattern 112a are formed. The first polishing process may include a chemical mechanical polishing (CMP) process and/or an etch back process.

Portions of the protrusions 110a, rather than the sacrificial layer 112, are primarily removed in the first polishing process. For example, slurry polishing the first single crystalline silicon layer 110 to a greater extent than the sacrificial layer 112 may be used in the first polishing process. More particularly, when the sacrificial layer 112 includes a silicon oxide, a slurry including about 0.5% to about 20% by weight of a silica abrasive, about 0.001% to about 1.0% by weight of an amine compound, and/or about 0.001% to about 1.0% by weight of a surfactant and water may be used in the first polishing process. The slurry may have a pH from about 8 to about 12.

A first portion of the sacrificial layer 112 on the protrusions 110a has an area smaller than that of a second portion of the sacrificial layer 112 between the protrusions 110a (i.e., beneath which the protrusions 110a are not formed). Additionally, a pressure applied to the first portion of the sacrificial layer 112 may be greater than that applied to the second portion of the sacrificial layer 112, because a pressure to a protrusive portion may normally be greater than that to a substantially planar portion. Thus, the first portion of the sacrificial layer 112 on the protrusions 110a may be more easily removed by the first polishing process. As a result, the protrusions 110a of the first single crystalline silicon layer 110 may be almost entirely removed.

The second portion of the sacrificial layer 112 is relatively widely formed on portions of the first single crystalline silicon layer 110 that are not vertically protruded, and a relatively low pressure may be applied thereto. Thus, the second portions of the sacrificial layer 112 between the protrusions 110a may be rarely removed in the first polishing process. As a result, the portions of the first single crystalline silicon layer 110 that are not protruded and covered by the second portion of the sacrificial layer 112 may be polished relatively little in the first polishing process.

When the protrusions 110a are polished by the first polishing process to less than about 5% of an initial height, portions of the first single crystalline silicon layer 110 that are not protruded may be removed. As a result, the second single crystalline silicon layer 114 may have relatively poor flatness/thickness uniformity even though successive processes may be performed. Additionally, portions of the first single crystalline silicon layer 110 may be unnecessarily removed such that the thickness of the second single crystalline silicon layer 114 may be reduced. When protrusions 110a are polished by the first polishing process to more than about 50% of the initial height, the second single crystalline silicon layer 114 may also have relatively poor flatness and/or thickness uniformity even though successive processing may be performed, because of a height difference between remaining protrusions 110a and the portion of the first single crystalline silicon layer 110 that is not protruded. Thus, according to some embodiments of the present invention, the protrusions 110a may be lowered to about 5% to about 50% of the initial height in the first polishing process. Here, the height of the protrusions 110a means a height from an upper surface of the portion of the first single crystalline silicon layer 110 that is not protruded to a peak of the protrusions 110a.

The second single crystalline silicon layer 114 may have an upper surface that is flatter/more planar than that of the first single crystalline silicon layer 110 because the majority of the protrusions 110a of the first single crystalline silicon layer 110 may be removed by the first polishing process. Additionally, the second single crystalline silicon layer 114 having the sacrificial layer 112 thereon may have a thickness greater than that of a single crystalline silicon layer formed without the use of the sacrificial layer 112, because the protrusions 110a may be substantially removed by the first polishing process as described above.

Figure 6:
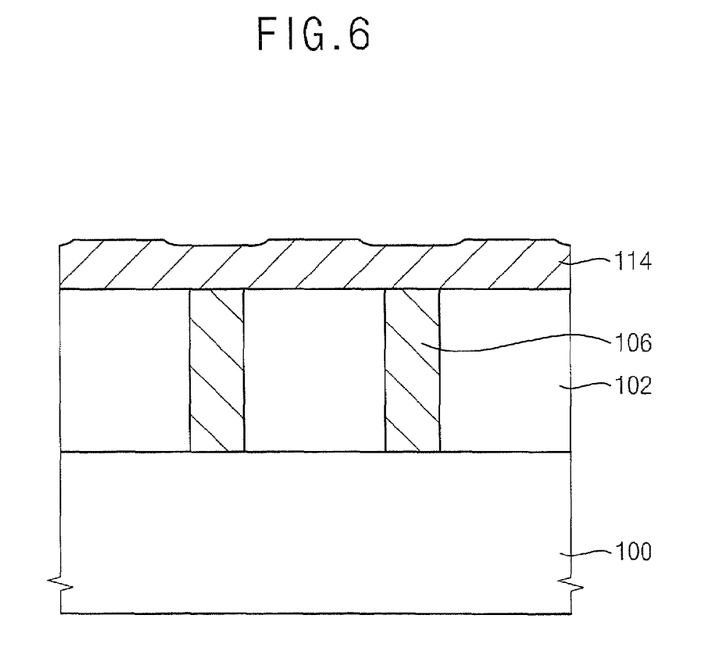

Referring to FIG. 6, the sacrificial layer pattern 112a that remains after the first polishing process is removed from the second single crystalline silicon layer 114. The sacrificial layer pattern 112a may be removed, in a manner so as to reduce and/or minimize damage to a top surface of the second single crystalline silicon layer 114. For example, when a dry etching process is performed to remove the sacrificial layer pattern 112a, the top surface of the second single crystalline silicon layer 114 may be damaged. Thus, in some embodiments of the present invention, the sacrificial layer pattern 112a may be removed by a wet etching process in which damage to the top surface of the second single crystalline silicon layer 114 may be reduced and/or minimized. For example, an etching solution including phosphoric acid may be used for removing the sacrificial layer pattern 112a when the sacrificial layer pattern 112a includes silicon nitride. In addition, an etching solution including Limulus Amebocyte Lysate (LAL) solution may be used for removing the sacrificial layer pattern 112a when the sacrificial layer pattern 112a includes silicon oxide.

When the sacrificial layer pattern 112a is removed from the second single crystalline silicon layer 114, the second single crystalline silicon layer 114 may include protrusions having a height significantly lower than that of the protrusions 110a of the first single crystalline silicon layer 110.

Figure 7:
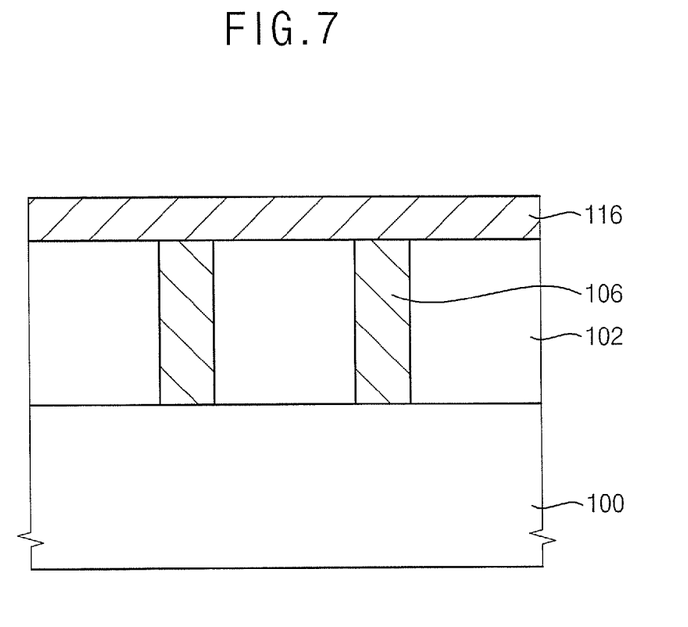

Referring to FIG. 7, the top surface of the second single crystalline silicon layer 114 is polished by a second polishing process, so that a silicon channel layer 116 having a substantially planar or flat upper surface may be formed. In some embodiments of the present invention, the second polishing process may be performed by a CMP process and/or an etch back process.

The second polishing process may be performed until the silicon channel layer 116 has a surface roughness root mean square (RMS) of about 0.5 Å to about 5 Å. In some embodiments, the second polishing process may be performed until the silicon channel layer 116 has a surface roughness RMS of about 0.5 Å to about 2 Å.

The CMP process for planarizing the first single crystalline silicon layer 110 may be performed only once in conventional methods. As such, not only protrusions 110a of the first single crystalline silicon layer 110 but also non-protruding portions of the first single crystalline silicon layer 110 may be removed in order to completely remove the protrusions 110a from the first single crystalline silicon layer 110. Thus, the first single crystalline silicon layer 110 may be initially formed to have a relatively large thickness so that the silicon channel layer 116 may have a predetermined thickness after the polishing process, because a significant portion of the first single crystalline silicon layer 110 may be removed in the polishing process. However, when the first single crystalline silicon layer 110 has a relatively large thickness, the single crystalline silicon layer 110 may have an increased number of defects. Thus, unit elements, such as MOS transistors formed on the silicon channel layer 116, may have poor operating characteristics in accordance with such conventional methods.

Additionally, in some conventional methods, the silicon channel layer 116 may have a relatively thin thickness due to polishing of the first single crystalline silicon layer 110 to remove the protrusions 110a. In this case, an on-current of a transistor formed on the silicon channel layer 116 may be decreased, as further discussed with reference to the comparative examples below.

According to some embodiments of the present invention, the silicon channel layer 116 having a substantially flat upper surface may be formed without substantially removing non-protruding portions of the first single crystalline silicon layer 110. The first single crystalline silicon layer 110, which is polished to form the silicon channel layer 116, may be initially formed to a relatively small and/or other desired thickness because the first single crystalline silicon layer 110 is removed little in a subsequent polishing process. Additionally, the silicon channel layer 116 may have a reduced defect density because the first single crystalline silicon layer 110 is formed to a relatively small thickness.

FIGS. 8 to 14 are cross-sectional views illustrating methods of manufacturing stacked memory devices in accordance with some embodiments of the present invention.

Figure 8:
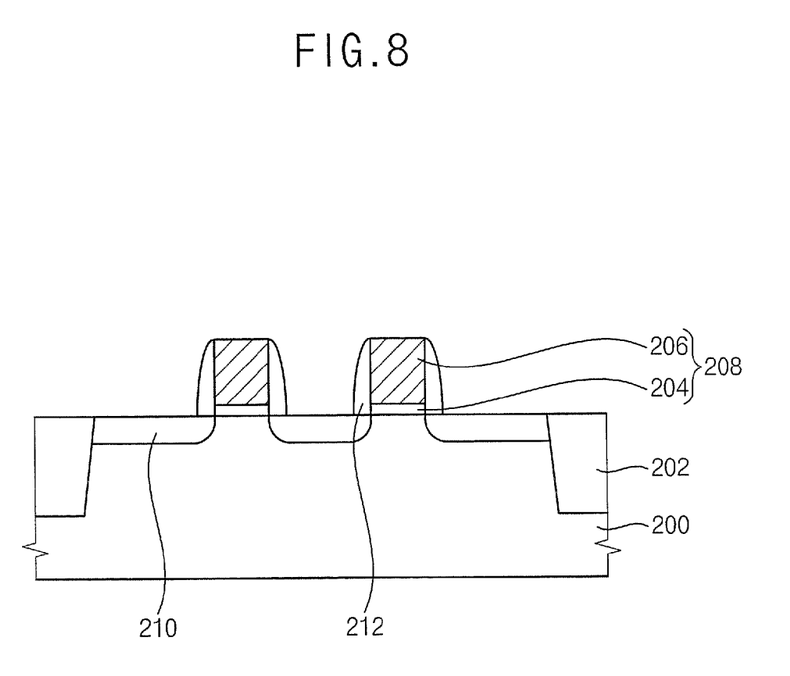
FIGS. 8 to 14 are cross-sectional views illustrating methods of manufacturing a stacked memory device in accordance with some embodiments of the present invention.

Referring to FIG. 8, an isolation layer 202 is formed on a single crystalline silicon substrate 200, for example, by a shallow trench isolation (STI) process, thereby defining a lower active region.

A first gate structure 208 including a first gate insulation layer pattern 204 and a first gate electrode 206, and a first impurity region 210 are formed on the lower active region of the single crystalline silicon substrate 200. As a result, a first transistor serving as a switching device is formed on the single crystalline silicon substrate 200. In some embodiments of the present invention, a plurality of the first transistors is formed on the single crystalline silicon substrate 200.

More particularly, an upper portion of the single crystalline silicon substrate 200 is oxidized to form the first gate insulation layer including a silicon oxide. A first conductive layer is formed on the first gate insulation layer. The first gate insulation layer and the first conductive layer are patterned to form the first gate insulation layer 204 and the first gate electrode 206 sequentially stacked on the single crystalline silicon substrate 200. A process forming a first hard mask (not shown) on the first conductive layer may be further performed for patterning the first conductive layer and the first gate insulation layer. The first conductive layer may be formed using polysilicon doped with n-type impurities.

A first spacer 212 is formed on a sidewall of the gate electrode 206. A liner serving as an etch stop layer in a successive process is formed on the first spacer 212, the first gate electrode 206 and the single crystalline silicon substrate 200. The liner may be formed using a nitride.

After implanting impurities onto an upper portion of the single crystalline silicon substrate 200 adjacent to the first gate electrode 206, a heat treatment is performed on the upper portion of the single crystalline silicon substrate 200 to form a first impurity region 210. When the first transistor is an n-type transistor, the impurities may include phosphorous (P), arsenic (As), etc.

Figure 9:
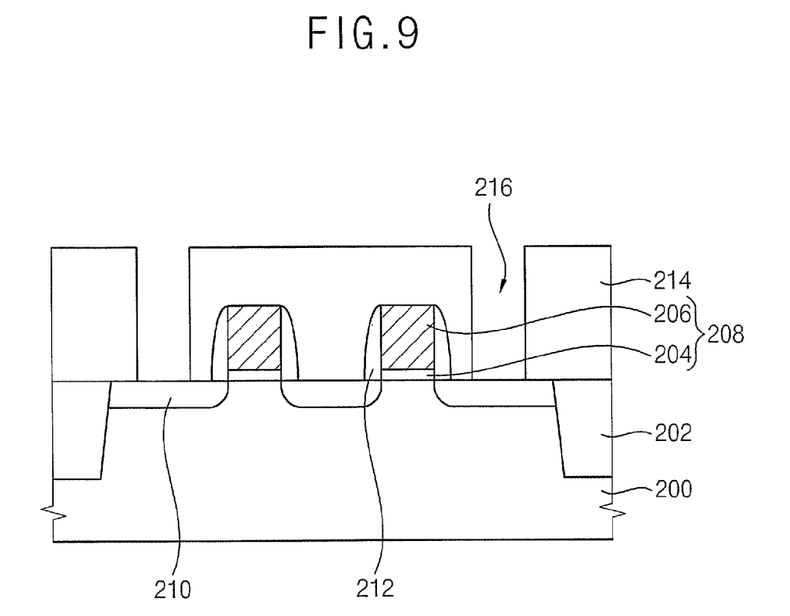

Referring to FIG. 9, a first insulating interlayer 214 is formed on the single crystalline silicon substrate 200 to cover the first transistor. More particularly, after forming an insulation layer on the single crystalline silicon substrate 200 to cover the first transistor, a top surface of the insulation layer is planarized. Thus, the first insulating interlayer 214 covering the first transistor may be formed on the single crystalline silicon substrate 200.

The first insulation layer 214 is partially removed to form a first opening 216 therethrough. The first opening 216 may expose an upper portion of the single crystalline silicon substrate 200. More particularly, the first opening 216 may expose an upper portion of the first impurity region 210 of the single crystalline silicon substrate 200.

Processes substantially similar to those illustrated with reference to FIGS. 4 and 5 are performed, thereby forming a structure illustrated in FIG. 10.

Figure 10:
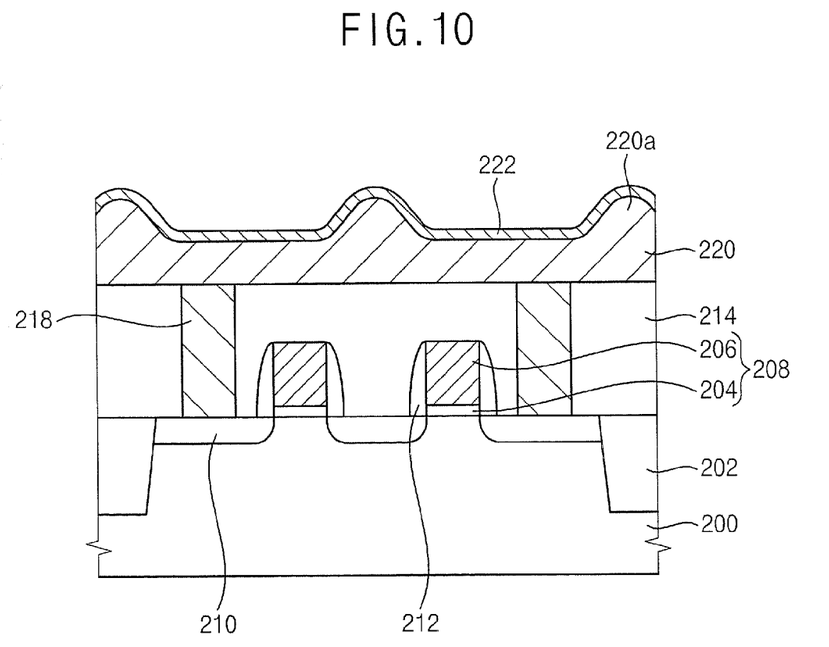

More particularly, referring to FIG. 10, a first epitaxial layer pattern 218 is formed on the exposed upper portion of the first impurity region 210 to fill the first opening 216. An amorphous silicon layer is formed on the first epitaxial layer pattern 218 and the first insulating interlayer 214. The amorphous silicon layer is phase-transformed into a single crystalline silicon layer, that is, a first single crystalline silicon layer 220 having protrusions 220a. In some embodiments of the present invention, the amorphous silicon layer is phase-transformed into the first single crystalline silicon layer 220 by a laser beam irradiation process. A sacrificial layer 222 serving as a polish stop layer is formed on the first single crystalline silicon layer 220.

Figure 11:
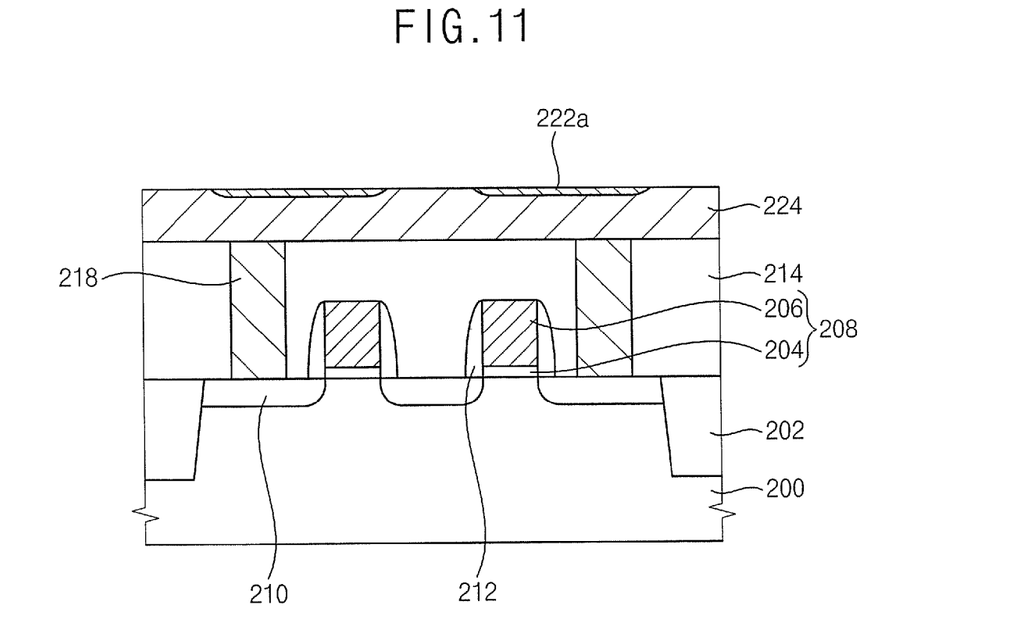

Referring to FIG. 11, portions of the protrusions 110a and portions of the sacrificial layer 222 on the protrusions 110a are removed by a first polishing process, so that a second single crystalline silicon layer 224 including remaining portions of the protrusions 220a and a sacrificial layer pattern 222a are formed. The first polishing process may include a CMP process and/or an etch back process.

Portions of the protrusions 220a rather than the sacrificial layer 222 are mainly removed in the first polishing process. For example, slurry polishing the first single crystalline silicon layer 220 to a greater extent than the sacrificial layer 222 may be used in the first polishing process. More particularly, when the sacrificial layer 222 includes a silicon oxide, a slurry including about 0.5% to about 20% by weight of a silica abrasive, about 0.001% to about 1.0% by weight of an amine compound, and/or about 0.001% to about 1.0% by weight of a surfactant and water may be used in the first polishing process. The slurry may have a pH from about 8 to about 12. The protrusions 110a may be polished to about 5% to about 50% of an initial height in the first polishing process.

Figure 12:
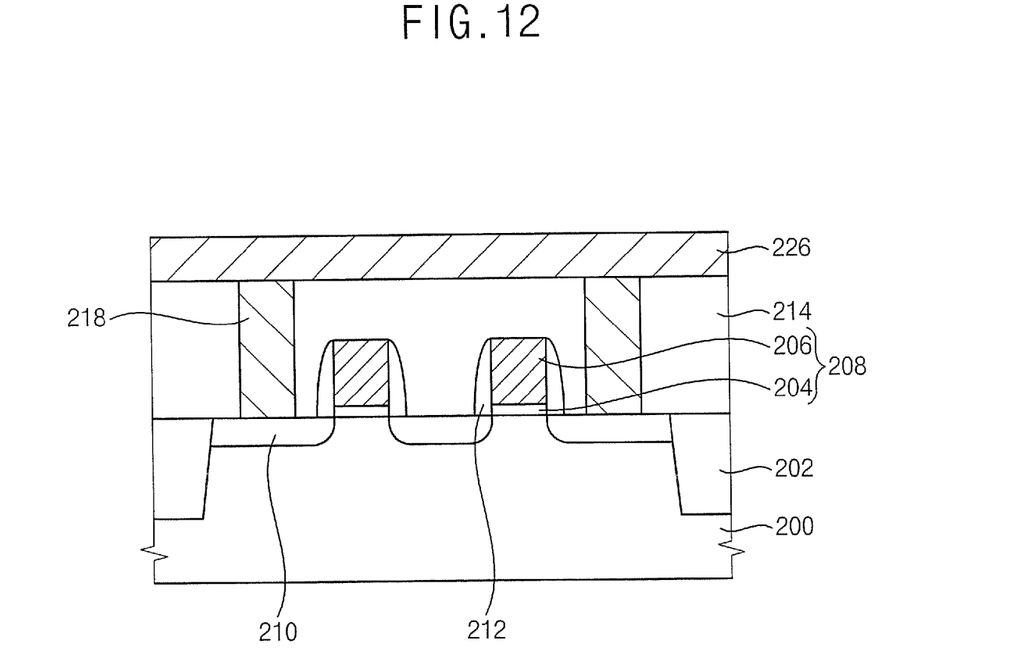

Referring to FIG. 12, the sacrificial layer pattern 222a is removed from the second single crystalline silicon layer 224. A top surface of the second single crystalline silicon layer 224 is polished by a second polishing process, so that a silicon channel layer 226 having a substantially planar or flat upper surface may be formed.

The second polishing process may be performed until the silicon channel layer 226 has a surface roughness RMS of about 0.5 Å to about 5 Å. In some embodiments, the second polishing process may be performed until the silicon channel layer 226 has a surface roughness RMS of about 0.5 Å to about 2 Å.

Figure 13:
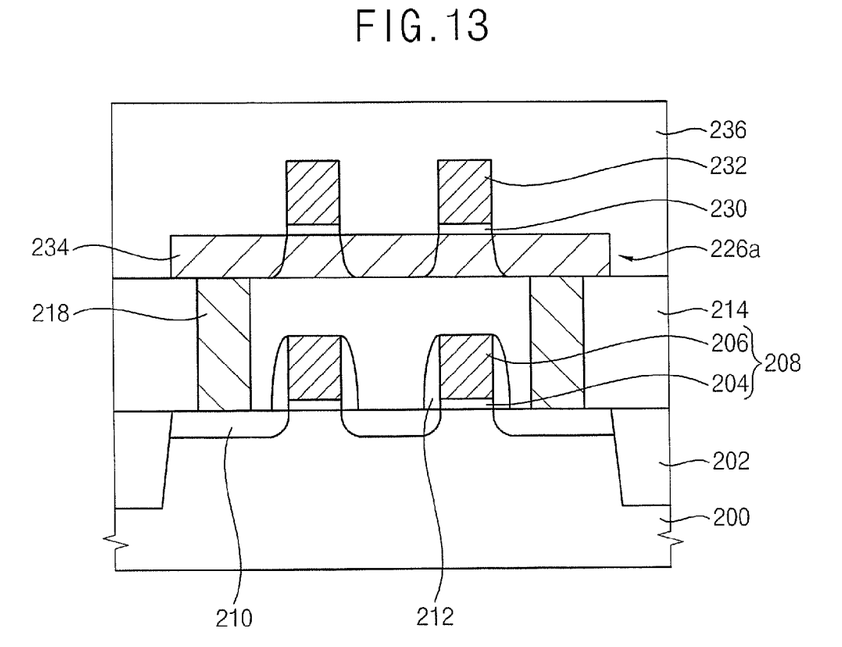

Referring to FIG. 13, a second hard mask (not shown) is formed on the silicon channel layer 226. The second hard mask may include a pad oxide layer pattern and a silicon nitride layer pattern sequentially stacked. The second hard mask may be formed on the silicon channel layer 226 to cover a portion of the silicon channel layer 226 that serves as an upper active region.

The silicon channel layer 226 is partially removed to form a silicon channel layer pattern 226a by an anisotropic etching process using the second hard mask as an etching mask.

A second transistor is formed on the silicon channel layer pattern 226a. More particularly, a second gate insulation layer is formed on the silicon channel layer pattern 226a. A second conductive layer is formed on the second gate insulation layer. The second conductive layer and the second gate insulation layer are patterned to form a second gate insulation layer pattern 230 and a second gate electrode 232 sequentially stacked. Impurities are implanted into an upper portion of the channel silicon pattern 226a adjacent to the second gate electrode 232 to form a second impurity region 234. The second impurity region 234 may serve as a source/drain region. The second transistor may have an impurity type different from that of the first transistor. In some embodiments, when the second transistor is a p-type transistor, impurities for forming the second impurity region 234 may include boron (B).

A second insulating interlayer 236 is formed on the silicon channel layer pattern 226a and the first insulating interlayer 214 to cover the second transistor.

Figure 14:
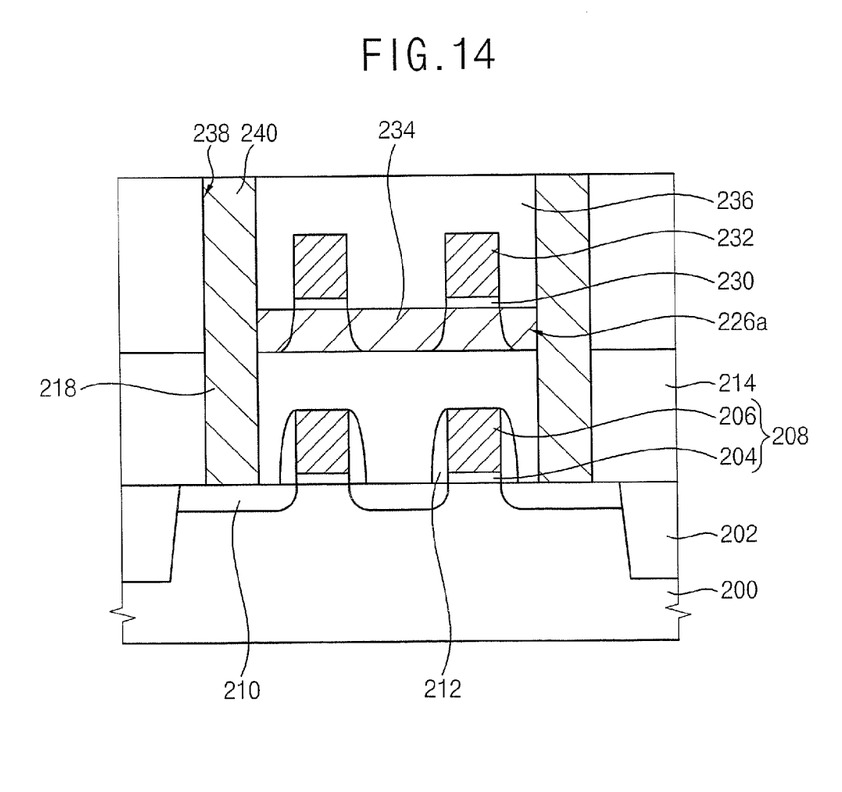

Referring to FIG. 14, a third hard mask (not shown) is formed on the second insulating interlayer 236. The third hard mask may serve as an etching mask to form a second opening 238 partially exposing the single crystalline silicon substrate 200.

More particularly, the second insulating interlayer 236, the silicon channel layer pattern 226a, and the first epitaxial layer pattern 216 are sequentially etched using the third mask as an etching mask to form the second opening 238. A sidewall of the silicon channel layer pattern 226a and an upper portion of the single crystalline silicon substrate 200 are exposed by the second opening 238.

The second opening 238 is filled with a conductive material to form a first plug 240. The first plug 240 may electrically connect the first impurity region 210 to the second impurity region 234.

A second plug (not shown) electrically connected to the second impurity region 234 may be further formed.

As illustrated above, transistors stacked in two layers may be formed. Although methods of forming transistors and methods of electrically connecting the transistors are described above, the above-described advantages of some embodiments of the present invention may be employed methods of manufacturing semiconductor memory devices. For example, some embodiments of the present invention may be employed in manufacturing static random access memory (SRAM) devices having six transistors in a unit cell.

Additionally, processes substantially similar to those illustrated with reference to FIGS. 9 to 12 may be performed to form a second silicon channel layer pattern having a substantially flat/planar upper surface on the second insulating interlayer 236. Thus, a semiconductor device having a stacked structure in which three or more stacked silicon channel layer patterns may be formed.

Measurement of an On-state Current in a Transistor According to a Thickness of a Silicon Channel Layer

EXAMPLE 1

A silicon channel layer was formed on a substrate to have a thickness of about 29.5 nm, and a first transistor was formed on the silicon channel layer.

EXAMPLE 2

A silicon channel layer was formed on a substrate to have a thickness of about 25.9 nm, and a second transistor was formed on the silicon channel layer.

EXAMPLE 3

A silicon channel layer was formed on a substrate to have a thickness of about 19.6 nm, and a third transistor was formed on the silicon channel layer.

EXAMPLE 4

A silicon channel layer was formed on a substrate to have a thickness of about 16.3 nm, and a fourth transistor was formed on the silicon channel layer.

Experiment 1

On-state currents in the first, second, third and fourth transistors were measured respectively, and results of the on-state currents are shown in Table 1.

TABLE 1

|  | Example 1 | Example 2 | Example 3 | Example 4 |
|---|---|---|---|---|
| Current (μA) | 7.76 | 9.78 | 0.08 | 0.02 |

As shown in Table 1, when a silicon channel layer has a thickness below about 20 nm, an on-state current in a transistor formed on the silicon channel layer may be decreased. As a result, an operation speed of the transistor on the silicon channel layer may be decreased, and thus a stacked semiconductor device including the transistor may have relatively poor operation characteristics.

Measurement of a Removed Thickness of a First Single Crystalline Silicon Layer in a Polishing Process

EXAMPLE EMBODIMENT OF THE PRESENT INVENTION

A first single crystalline silicon layer was formed on a substrate by processes substantially similar to those illustrated with reference to FIGS. 1 to 3. A non-protruding portion of the first single crystalline silicon layer had a thickness of about 516 Å, and the first single crystalline silicon layer had a surface roughness RMS of about 240 Å. An upper portion of the first single crystalline silicon layer was planarized by processes substantially similar to those illustrated with reference to FIGS. 4 to 7, thereby forming a silicon channel layer having a surface roughness RMS of about 5 Å.

Comparative Example 1

A first single crystalline silicon layer was formed on a substrate by processes substantially similar to those illustrated with reference to FIGS. 1 to 3. A portion of the first single crystalline silicon layer that was not protruded had a thickness of about 516 Å, and the first single crystalline silicon layer had a surface roughness RMS of about 240 Å. An upper portion of the first single crystalline silicon layer was planarized by a conventional CMP process, thereby forming a silicon channel layer having a surface roughness RMS of about 5 Å. In this case, the CMP process was performed only once, and a sacrificial layer was not formed on the first single crystalline silicon layer.

Comparative Example 2

A first single crystalline silicon layer was formed on a substrate by processes substantially similar to those illustrated with reference to FIGS. 1 to 3. A portion of the first single crystalline silicon layer that was not protruded had a thickness of about 516 Å, and the first single crystalline silicon layer had a surface roughness RMS of about 240 Å.

An upper portion of the first single crystalline silicon layer was planarized by a conventional CMP process, thereby forming a silicon channel layer having a surface roughness RMS of about 9 Å. In this case, the CMP process was performed only once, and a sacrificial layer was not formed on the first single crystalline silicon layer.

Experiment 2

Thicknesses of the silicon channel layers and removed thicknesses in a polishing process of the first single crystalline silicon layers in the Example Embodiment and Comparative Examples 1 and 2, respectively, were measured.

Additionally, thickness ranges of the silicon channel layers in the Example Embodiment and Comparative Examples 1 and 2, respectively, were measured. The thickness range of the silicon channel layer means a thickness difference between a portion having the largest thickness and a portion having the smallest thickness in the silicon channel layer.

TABLE 2

|  | Example Embodiment | Comparative Example 1 | Comparative Example 2 |
|---|---|---|---|
| Thickness of a First Single Crystalline Silicon Layer | 516 Å | 516 Å | 516 Å |
| Thickness of a Silicon Channel Layer | 370 Å | 318 Å | 361 Å |
| Removed Thickness in a Polishing Process | 146 Å | 198 Å | 152 Å |
| Thickness Range of a Silicon Channel Layer | 29 Å | 40 Å | 30 Å |
| Surface Roughness RMS of a First Single Crystalline Silicon Layer | 240 Å | 240 Å | 240 Å |
| Surface Roughness RMS of a Silicon Channel Layer | 5 Å | 5 Å | 9 Å |

As shown in Table 2, according to the Example Embodiment, about 146 Å of the first single crystal silicon layer was removed in a polishing process in order to form a silicon channel layer having a surface roughness RMS of about 5 Å. However, according to Comparative Example 1, an upper portion of the first single crystalline silicon layer having a thickness of about 198 Å was removed in a polishing process in order to form a silicon channel layer having a surface roughness RMS of about 5 Å.

That is, when a silicon channel layer having a surface roughness RMS of about 5 Å is formed, a removed thickness of the first single crystalline silicon layer in a polishing process according to the Example Embodiment may be smaller than that of Comparative Example 1 by about 50 Å. Thus, a silicon channel layer formed in the Example Embodiment may have a thickness larger than that of Comparative Example 1 by about 50 Å.

Additionally, a silicon channel layer formed in Comparative Example 2 had a surface roughness RMS of about 9 Å, which is poorer than that of the Example Embodiment, when an upper portion of the first single crystalline silicon layer in Comparative Example 2 was removed in a polishing process to a degree similar to that of the Example Embodiment.

As shown above, according to the Example Embodiment, a silicon channel layer having a substantially flat or planar upper surface may be formed even though a relatively small portion of the first single crystalline silicon layer is removed in a polishing process. Thus, a silicon channel layer may be formed to have a sufficiently large thickness, so that a stacked semiconductor device including the silicon channel layer may have improved operational characteristics.

A thickness range of a silicon channel layer formed in the Example Embodiment was about 29 Å, and a thickness range of a silicon channel layer formed in Comparative Example 2 was about 40 Å. A silicon channel layer formed in the Example Embodiment may have a thickness range smaller than that of Comparative Example 1, which means that the silicon channel layer formed in the Example Embodiment may have a substantially uniform thickness at all positions.

According to some embodiments of the present invention, a silicon channel layer having improved surface roughness characteristics and a substantially uniform thickness may be formed even though a portion of a relatively thin first single crystalline silicon layer may be removed in a polishing process for forming the silicon channel layer. Thus, a transistor formed on the silicon channel layer may have improved operating characteristics, so that a stacked memory device including the transistor may have an improved performance.

The foregoing is illustrative of the present invention and is not to be construed as limiting thereof. Although a few example embodiments of the present invention have been described, those skilled in the art will readily appreciate that many modifications are possible in the example embodiments without materially departing from the teachings and advantages of the present invention. Accordingly, all such modifications are intended to be included within the scope of the present invention as defined in the following claims.

That which is claimed:

1. A method of fabricating a semiconductor device including a channel layer, the method comprising:
   forming a single crystalline silicon layer on a single crystalline silicon substrate, the single crystalline silicon layer having a protrusion extending from a surface thereof;
   forming a sacrificial layer on the single crystalline silicon layer;
   removing a portion of the sacrificial layer and a portion of the protrusion of the single crystalline silicon layer in a first polishing process to define a sacrificial layer pattern and a remaining portion of the protrusion;
   removing the sacrificial layer pattern; and then
   planarizing the surface of the single crystalline silicon layer in a second polishing process to remove the remaining portion of the protrusion and define a substantially planar silicon channel layer.

2. The method of claim 1, prior to forming the single crystalline silicon layer, further comprising:
   forming an insulating interlayer having an opening extending therethrough on the single crystalline silicon substrate, the opening exposing a surface of the single crystalline silicon substrate; and
   forming a single crystalline silicon pattern on the exposed surface of the single crystalline silicon substrate to fill the opening.

3. The method of claim 2, wherein forming the single crystalline silicon pattern comprises:
   performing a selective epitaxial growth (SEG) process using the exposed surface of the single crystalline silicon substrate as a seed.

4. The method of claim 2, wherein forming the single crystalline silicon layer comprises:
   forming an amorphous silicon layer on the insulating interlayer and the single crystalline silicon pattern; and
   crystallizing the amorphous silicon layer to form the single crystalline silicon layer using the single crystalline silicon pattern as a seed.

5. The method of claim 4, wherein the amorphous silicon layer is formed to a thickness of about 500 Å to about 5000 Å.

6. The method of claim 4, wherein crystallizing the amorphous silicon layer comprises:
   scanning a laser beam onto the amorphous silicon layer.

7. The method of claim 1, wherein the sacrificial layer is formed to a thickness of about 10 Å to about 1000 Å.

8. The method of claim 1, wherein the sacrificial layer comprises silicon oxide and/or silicon nitride.

9. The method of claim 1, wherein the first polishing process is performed using a slurry having a higher polishing rate with respect to the single crystalline silicon layer than the sacrificial layer.

10. The method of claim 9, wherein sacrificial layer comprises silicon oxide, and wherein the first polishing process is performed using a slurry comprising about 0.5% to about 20% by weight of a silica abrasive, about 0.001% to about 1.0% by weight of an amine compound, and/or about 0.001% to about 1.0% by weight of a surfactant and water, the slurry having a pH from about 8 to about 12.

11. The method of claim 1, wherein the first polishing process is performed until the remaining portion of the protrusion of the single crystalline silicon layer comprises about 5% to about 50% of an initial height of the protrusion.

12. The method of claim 1, wherein the second polishing process is performed until the silicon channel layer has a surface roughness RMS of about 0.5 Å to about 5 Å.

13. The method of claim 1, wherein removing the sacrificial layer pattern is performed by a wet etching process.

14. A method of manufacturing a semiconductor device, the method comprising:
   forming an insulating interlayer having an opening extending therethrough on a single crystalline silicon substrate, the opening exposing a surface of the single crystalline silicon substrate;
   forming a single crystalline silicon pattern on the exposed surface of the single crystalline silicon substrate to fill the opening;
   forming a single crystalline silicon layer on the insulating interlayer and the single crystalline silicon pattern, the single crystalline silicon layer having a protrusion extending from a surface thereof;
   forming a sacrificial layer on the single crystalline silicon layer;
   removing a portion of the sacrificial layer and a portion of the protrusion of the single crystalline silicon layer in a first polishing process to define a sacrificial layer pattern and a remaining portion of the protrusion;
   removing the sacrificial layer pattern;
   planarizing the surface of the second single crystalline silicon layer in a second polishing process to remove the remaining portion of the protrusion and define a substantially planar silicon channel layer; and
   forming a transistor on the silicon channel layer.

15. The method of claim 14, further comprising:
   forming a second transistor on the single crystalline silicon substrate prior to forming the insulating interlayer thereon.

16. The method of claim 14, wherein the first polishing process is performed using a slurry having a higher polishing rate with respect to the single crystalline silicon layer than the sacrificial layer.

17. The method of claim 14, wherein the first polishing process is performed until the remaining portion of the protrusion of the single crystalline silicon layer comprises about 5% to about 50% of an initial height of the protrusion.

18. The method of claim 14, wherein the second polishing process is performed until the silicon channel layer has a surface roughness RMS of about 0.5 Å to about 5 Å.

19. A method for fabricating a semiconductor device, the method comprising:

forming a single crystalline semiconductor layer on a semiconductor substrate, the single crystalline semiconductor layer having a protrusion extending from a surface thereof;

forming a sacrificial layer on the single crystalline semiconductor layer;

performing a first polishing process on the single crystalline semiconductor layer using the sacrificial layer as a polish stop to remove a majority of the protrusion such that the single crystalline semiconductor layer includes a remaining portion of the protrusion and to define a sacrificial layer pattern on the surface of the single crystalline semiconductor layer adjacent the remaining portion of the protrusion;

removing the sacrificial layer pattern; and then performing a second polishing process that is different from the first polishing process to remove the remaining portion of the protrusion and define a substantially planar single crystalline semiconductor layer having a substantially uniform thickness.

\* \* \* \* \*